United States Patent [19]

Fuke et al.

[11] Patent Number: 4,936,944
[45] Date of Patent: Jun. 26, 1990

[54] WAFER SUPPLYING APPARATUS

[75] Inventors: Shigeru Fuke, Higashikurume; Nobuto Yamazaki, Tachikawa; Kazuo Sugiura, Hachioji, all of Japan

[73] Assignee: Kabushiki Kaisha Shinkawa, Tokyo, Japan

[21] Appl. No.: 291,204

[22] Filed: Dec. 28, 1988

[30] Foreign Application Priority Data

Dec. 28, 1987 [JP] Japan .................................. 62-332619

[51] Int. Cl.⁵ ............................................ B32B 31/18
[52] U.S. Cl. ...................................... 156/584; 29/413; 29/426.6; 156/344; 225/103
[58] Field of Search ............... 29/413, 426.6; 156/344, 156/584; 225/103-105; 414/749, 786

[56] References Cited

U.S. PATENT DOCUMENTS

3,537,603 11/1970 Willis et al. ........................ 29/413 X

Primary Examiner—Robert A. Dawson
Attorney, Agent, or Firm—Koda & Androlia

[57] ABSTRACT

A wafer supplying apparatus including a supply ring to which a wafer sheet having semiconductor pellets adhered thereto is attached, a ring holder provided on an X-Y table of a pellet pick-up device, the ring holder supporting and placing the wafer sheet onto the upper surface of a cylindrical portion of the ring holder having an external diameter smaller than the internal diameter of the supply ring, a pressing ring provided above the supply ring, a pusher which pushes down the supply ring around the cylindrical portion of the ring holder through the pressing ring, and a fastener which fastens the pressing ring to the ring holder after the supply ring has been pushed down by the pusher.

1 Claim, 10 Drawing Sheets

WAFER SUPPLYING APPARATUS

BACKGROUND OF THE INVENTION

1. Field of the Invention

The present invention relates to an apparatus which supplies wafers to a pellet pick-up device used in a pellet bonder, etc.

2. Prior Art

Conventionally, semiconductor pellets are supplied to pellet bonders, etc. in the following manner: As described in Japanese Patent Application Laid-Open No. 61-32813, a wafer bonded to a wafer sheet is cut by a scribe and separated into individual pellets. The wafer sheet with these pellets thereon is then stretched so that the individual pellets are separated at predetermined intervals, thus facilitating the supply of the pellets. Afterward, the wafer sheet is attached to a supply ring, which is a round plate.

Then, as is described in Japanese Patent Application Laid-Open No. 59-161040, a multiple number of supply rings are held in a stacked configuration in an elevator-type. These supply rings are then fed out one by one, and each supply ring is carried by suction-adhesion via an arm equipped with a wafer suction-adhesion plate, and then placed on an X-Y table of the pellet pick-up device. While this X-Y table is moved in the X and Y directions, the individual pellets are pushed up one at a time by lifting pins so that they picked are up by a suction-adhesion nozzle installed on a supply head.

In the conventional wafer supplying devices described above, preliminary work is required in order to stretch the wafer sheets which carry the pellets thereon and to attach the wafer sheets to the supply rings. In addition, mechanical devices must be provided in order to perform this preliminary work. Accordingly, there are problems in terms of the cost of such equipment and the increased amount of work required.

SUMMARY OF THE INVENTION

The object of the present invention is, therefore, to provide a wafer supplying apparatus which arranges pellets so that the pellets can be picked up one at a time, merely by attaching wafer sheets with adhering pellets thereon directly to supply rings without any pretreatment of the wafer sheets being required.

The problems found in the prior art are solved by the unique structure of the wafer supplying apparatus of this invention which includes a supply ring to which a wafer sheet having pellets adhered thereto is attached, a ring holder which is attached to an X-Y table of a pellet pick-up device, supporting and carrying the wafer sheet on the upper surface of a cylindrical part having an external diameter smaller than the internal diameter of the supply ring, an annular pressing ring which is installed above the ring holder and presses against a portion of the supply ring, a downward-pushing means which pushes the supply ring downward along the cylindrical part of the ring holder through the pressing ring, and a fastening means which fastens the pressing ring to the ring holder after the supply ring has been pushed downward by the downward-pushing means.

When the supply ring is pushed downward by the pressing ring after the wafer sheet has been supported on the upper surface of the cylindrical part of the ring holder, the pushing action causes the wafer sheet to be uniformly stretched in an outward direction. As a result, the individual pellets are separated from each other at predetermined intervals. In this state, individual wafer sheets are successively fed in the X and Y directions by the X-Y table of the pellet pick-up device, and the pellets are then picked up one at a time in the same manner as conventionally.

DETAILED DESCRIPTION OF THE INVENTION

An embodiment of the present invention will be described with reference to the attached drawings.

As shown in FIGS. 1 through 4, two guide bars 22 and 23 which are parallel to each other, both ends of which being supported by a base 21, are installed in the central part of the base 21.

As seen on the left side of FIGS. 1 through 6, a slider 26 is mounted on the guide bars 22 and 23 via slide ball bearings 24 and 25 so that the slider 26 freely slides along the guide bars 22 and 23. This slider 26 is connected by a pin 29 to an external piston 28 which is installed on the outer sleeve of a rodless air cylinder 27 installed between the guide bars 22 and 23 so that the cylinder 27 is parallel to the guide bars 22 and 23. As a result of the action of the external piston 28, the slider 26 can move along the guide bars 22 and 23.

The upper portion of the slider 26 is forked, and a fixed claw 30 which is used to chuck supply rings with wafer sheets attached thereto (to be described later) is installed across the upper ends of this forked portion. An L-shaped lever 32 which is swingably supported on a pin 31, both ends of which being fastened to the slider 26, is installed in the center of the forked portion of the slider 26. A movable claw 33 is fixed at one end of the upper portion of the lever 32 so that the claw 33 faces the fixed claw 30.

A spring-hooking pin 34, which protrudes outside of the forked portion of the slider 26 in both directions through windows (not shown) which are formed in the slider 26, is installed in the lower end of the lever 32 so that it passes through the lever 32 from side to side. Coil springs 37a and 37b are provided between both ends of this spring-hooking pin 34 and respective spring attachment parts 35 and 36 which are installed on the slider 26. A seat 40 which contacts the tip of the piston 39 of the air cylinder 38, which is fastened to the slider 26, is formed in the lower part of the lever 32.

An elevator magazine (known in prior art and not shown in the Figures) is positioned at the left end of the base 21. Supply ring 42 which has a wafer sheet 41 attached thereto (see FIGS. 2 and 3) are stacked inside this elevator magazine.

A wafer is bonded to each wafer sheet 41. After the wafers have been cut by a scribe and separated into individual pellets, the wafer sheet 41 is attached "as is" to one of the supply ring 42. Each of the supply rings consists of a thin annular part which has an internal diameter which is larger than the external diameter of the wafer. In the Figures, one of the wafer sheets 41 which is bonded with pellets and a supply ring 42 to which the wafer sheet 41 is attached are indicated in simplified form by a two-dot chain line.

When the slider 26 reaches the left end of the apparatus with the piston 39 of the air cylinder 38 of the slider 26 advanced so that the movable claw 33 is in an opened state, the edge of one of the supply rings 42, which has a wafer sheet attached thereon and held inside the elevator magazine, is positioned between the fixed claw 30 and the movable claw 33. When the piston 39 is retracted, the movable claw 33 closes so that the supply ring 42 is chucked. Then, when the slider 26 moves to the right (see FIGS. 1 and 2), a single supply ring 42 is pulled out of the elevator magazine. In order to insure that the supply ring 42 is pulled out in a stable position at this time, guide plates 43 and 44 are provided on the left end of the base 21 of both sides of the slider 26.

As shown in FIGS. 1 through 4, rails 45 and 46 are provided on both edges of the base 21 so that they are parallel to the guide bars 22 and 23. Respective open linear ball slides 47 and 48 are provided on the rails 45 and 46 so that the slides 47 and 48 are slidable on the rails 45 and 46.

Figure 4:
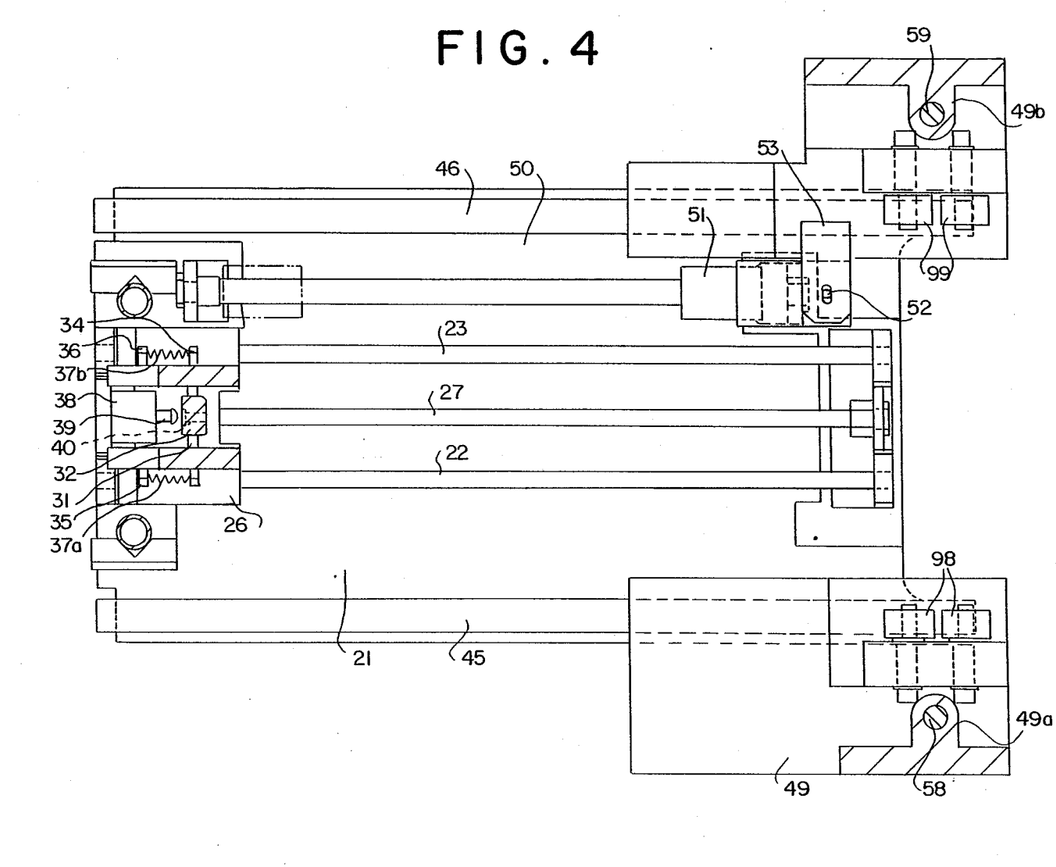
FIG. 4 is a cross sectional view along line IV—IV in FIG. 2.
Figure 5:
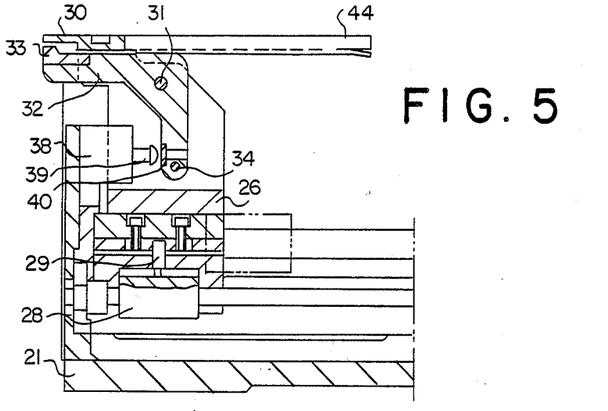
FIG. 5 is a cross sectional view along the line V—V in FIG. 1.
Figure 6:
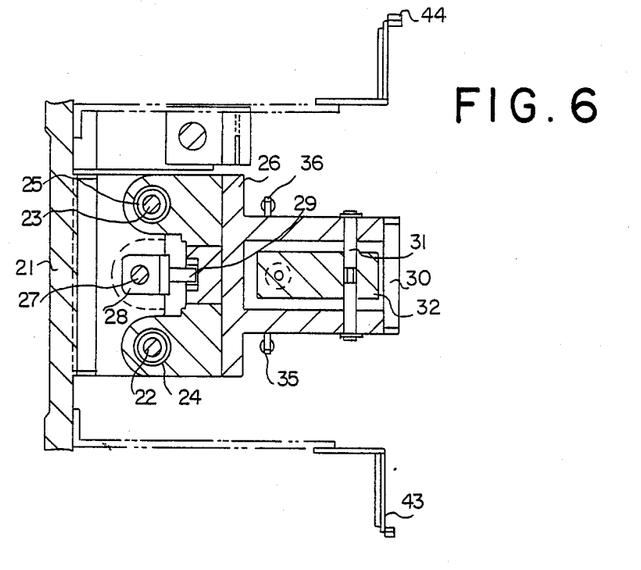
FIG. 6 is a cross sectional view along the line VI—VI.
Figure 7:
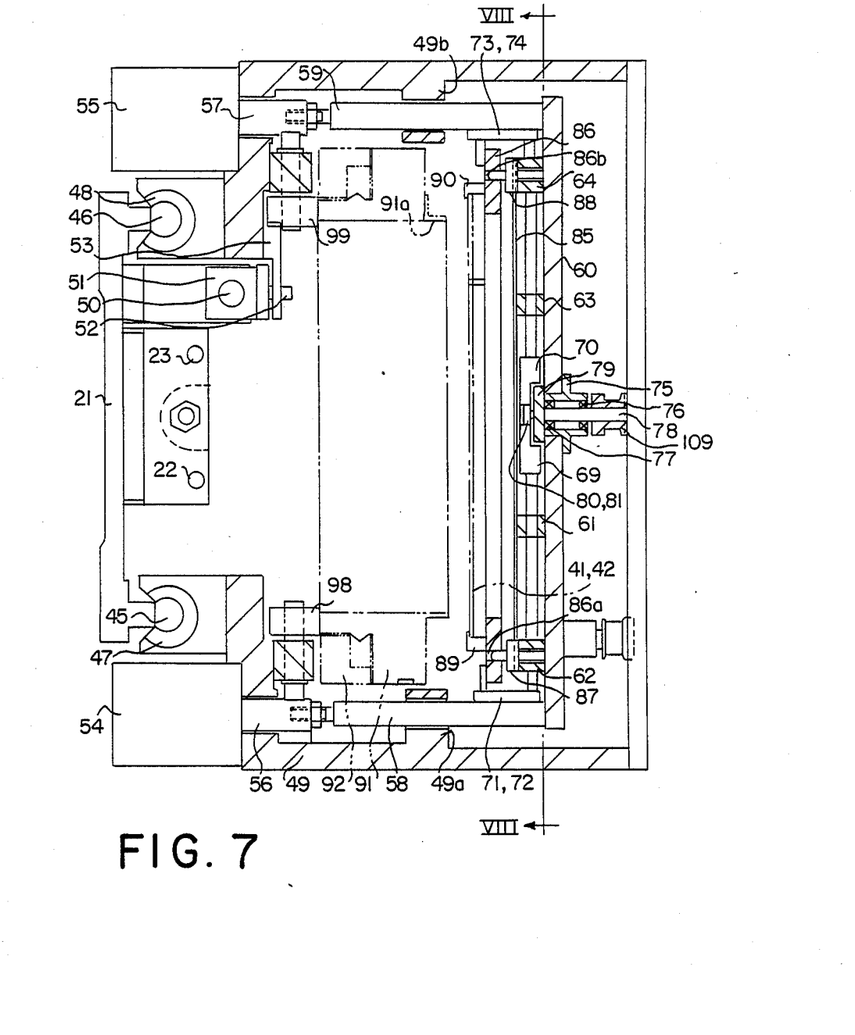
FIG. 7 is a cross sectional view along the line VII—VII in FIG. 1.

A gate-form column 49 which straddles the two rails 45 and 46 is provided on the liner ball slides 47 and 48. As shown in FIGS. 4 and 7, the gate-form column 49 is linked via a linking plate 53 to a pin 52 installed vertically on the external piston 51 of a rodless air cylinder 50 which is installed parallel to the guide bar 23 and fastened to the base 21. Accordingly, the gate-form column 49 can move along the rails 45 and 46 through the action of the external piston 51.

Figure 3:
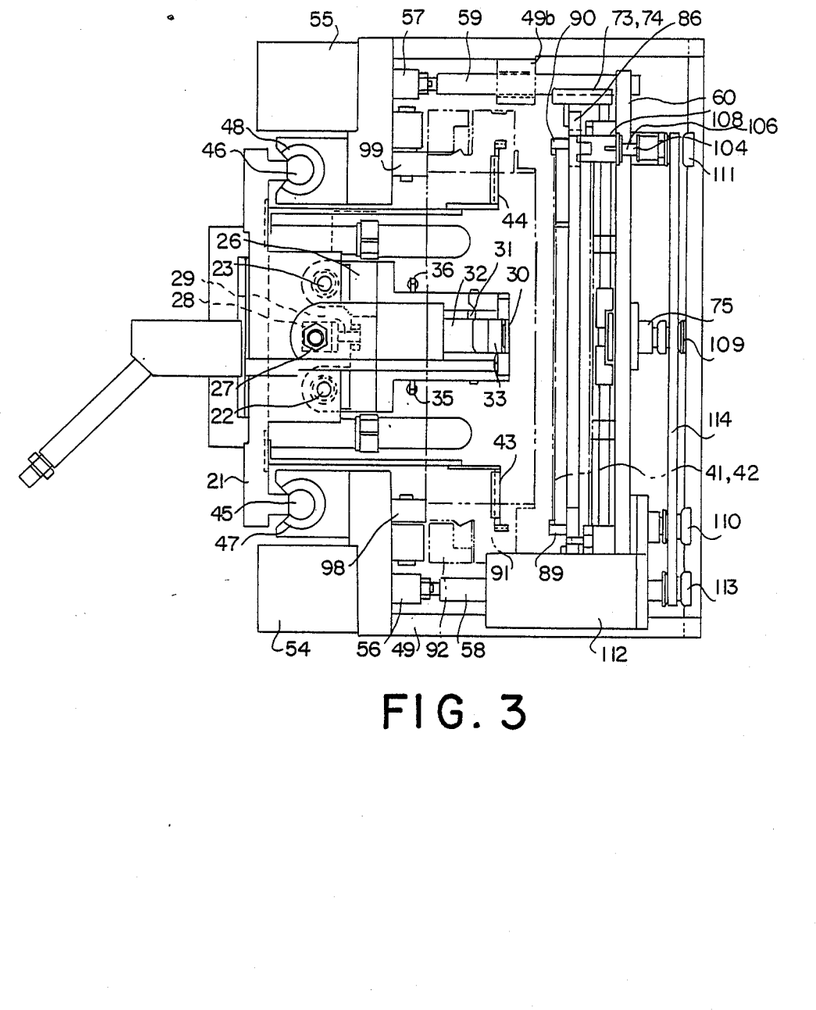
FIG. 3 is a left side view thereof.

As shown in FIGS. 3 and 7, air cylinders 54 and 55 are installed beneath the gate-form column 49 on both sides, adjacent to the linear ball slides 47 and 48. The pistons 56 and 57 of these air cylinders 54 and 55 are linked to the lower ends of rods 58 and 59 which are guided by guide parts 49a and 49b of the gate-form column 49. An elevator platform 60 is installed across the upper ends of the rods 58 and 59. This elevator platform 60 can be raised and lowered relative to the gate-form column 49 by the action of the pistons 56 and 57.

Figure 8:
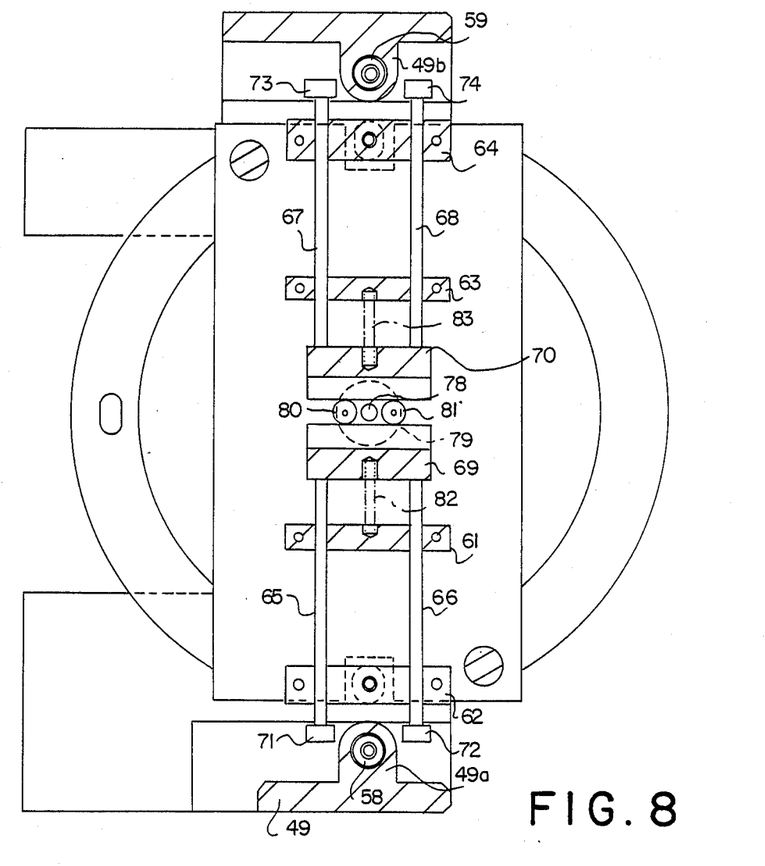
FIG. 8 is a cross sectional view taken along line VIII—VIII in Figure 7.

In FIGS. 7 and 8, four guide parts 61, 62, 63 and 64 are fixed to the underside of the elevator platform 60. Two pairs of parallel sliding rods 65 and 66, and 67 and 68 are supported by these guide parts 61, 62, 63 and 64 so that the sliding rods are free to slide.

Connecting parts 69 and 70 are fixed to the facing ends of these pairs of sliding rods 65 and 66 and 67 and 68, i.e., to the ends of the rods 65 and 66 which face the ends of the rods 67 and 68, and vice-versa, while L-shaped suspending parts 71, 72, 73 and 74 are fixed to the opposite ends of the respective sliding rods 65, 66, 67 and 68.

A housing 75 is provided in the central portion of the elevator platform 60, and a rotating shaft 78 is mounted so that it is free to rotate on bearings 76 and 77 installed in a central hole of the housing 7. A disk 79 is fixed to the lower end of the rotating shaft 78, and rollers 80 and 81 are installed on this disk 79 on opposite sides of the rotating shaft 78. The connecting parts 69 and 70 contact the rollers 80 and 81 by the force of coil springs 82 and 83 which are provided between the connecting parts 69 and 70 and the guide parts 61 and 63, respectively.

Figure 9:
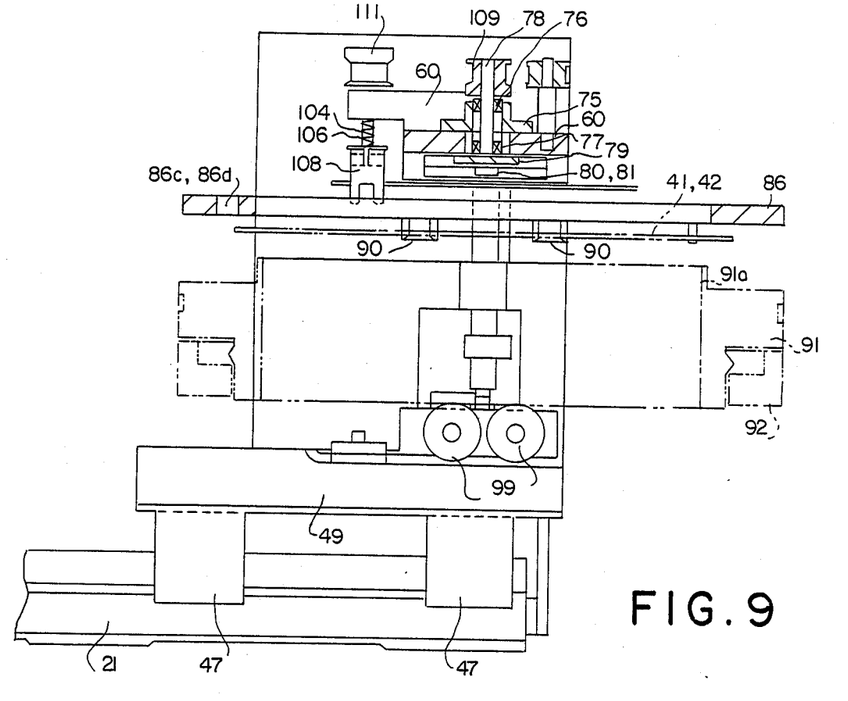
FIG. 9 is a cross sectional view taken along the IX—IX in FIG. 4.

A thin plate 85 is provided on the guide parts 61 through 64 beneath the elevator platform 60. As shown in FIGS. 3, 7 and 9, a pressing ring 86 is supported by the suspending parts 71, 72, 73 and 74. The pressing ring 86 having a central hole which is roughly equal in diameter to the internal diameter of the supply ring 42 is installed beneath the thin plate 85 so that the center of the ring 86 is on the axial line of the rotating shaft 78. Two positioning holes 86a and 86b are provided in the circumferential part of the pressing ring 86 at positions which are symmetrical with respect to the center of the ring 86. The pressing ring 86 is positioned by pins 87 and 88 having step portions which are formed on the guide parts 62 and 64, into the positioning holes 86a and 86b.

Furthermore, guide parts 89 and 90 for the supply ring 42 are provided on the underside of the pressing ring 86. The supply ring 42 is guided and supported by these guide parts 89 and 90 so that the ring 42 is positioned coaxially with the pressing ring 86.

Figure 1:
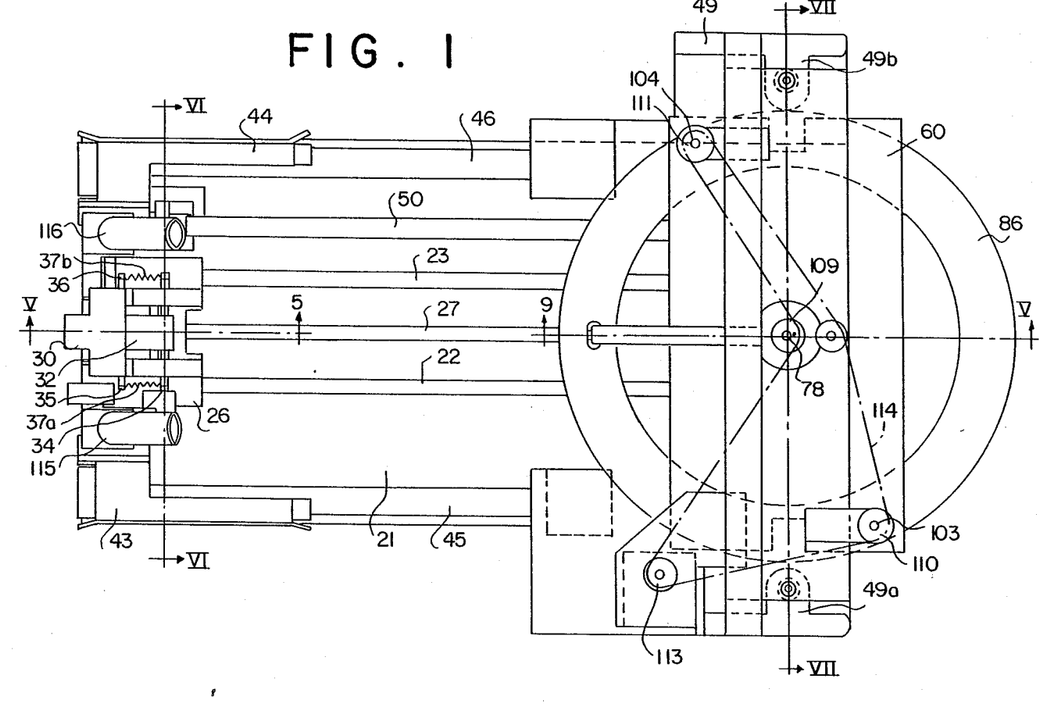
FIG. 1 is a plan view which illustrates an embodiment of a wafer supplying apparatus in accordance with the teachings of the present invention.
Figure 2:
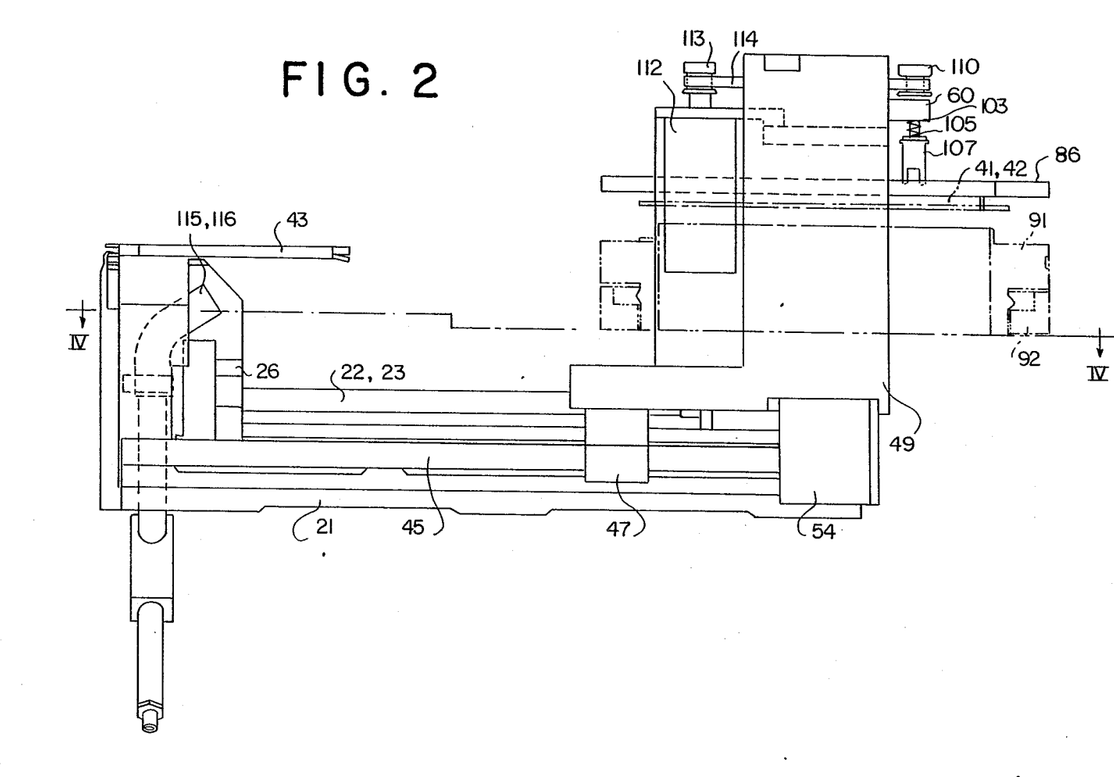
FIG. 2 is a front view thereof.

As shown in FIGS. 2, 7 and 9, a ring holder 91, which is supported by an X-Y table (known in the prior art and shown), is installed separately from the base 21. The ring holder 91 is provided so that it can extend through the inside arch of the gate-form column 49. Thus, the ring holder 91 is positioned so that it is beneath the pressing ring 86 when the pistons 56 and 57 are extended toward the right ends as shown in FIG. 1.

As shown in FIGS. 10 through 14, the ring holder 91 is supported vertically and horizontally via rollers 93 and 94 on a cantilever arm 92 which is fastened to the X-Y table (not shown) so that the ring holder 91 is free to rotate. A belt 97, which is mounted between the circumference of the ring holder 91 and a pulley 96 attached to the output shaft of a motor 95 installed on the cantilever arm 92, rotates the ring holder 91 when the motor 95 is activated. A cylindrical part 91a concentric with the pressing ring 86 and having an external diameter that is slightly smaller than the internal diameter of the supply ring 42 is located on the upper part of the ring holder 91. As seen in FIGS. 3, 4, 7 and 9, the ring holder 91 is also supported from below by supporting rollers 98 and 99, which are installed on the gate-form column 49, in order to prevent deformation due to bending of the cantilever arm 92.

Figure 10:
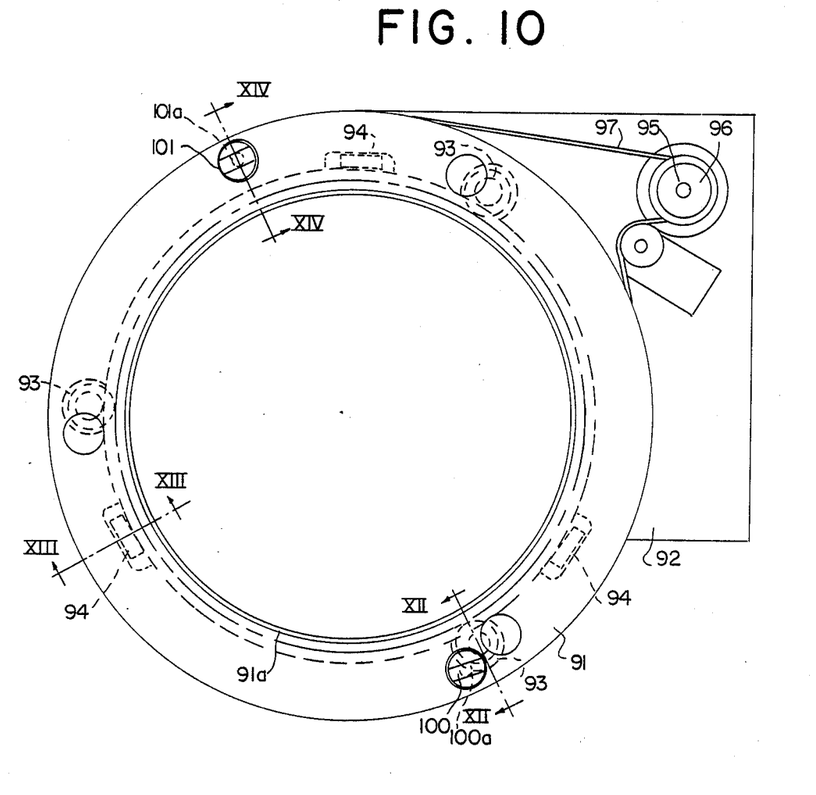
FIG. 10 is a plan view of a wafer attachment table.
Figure 11:
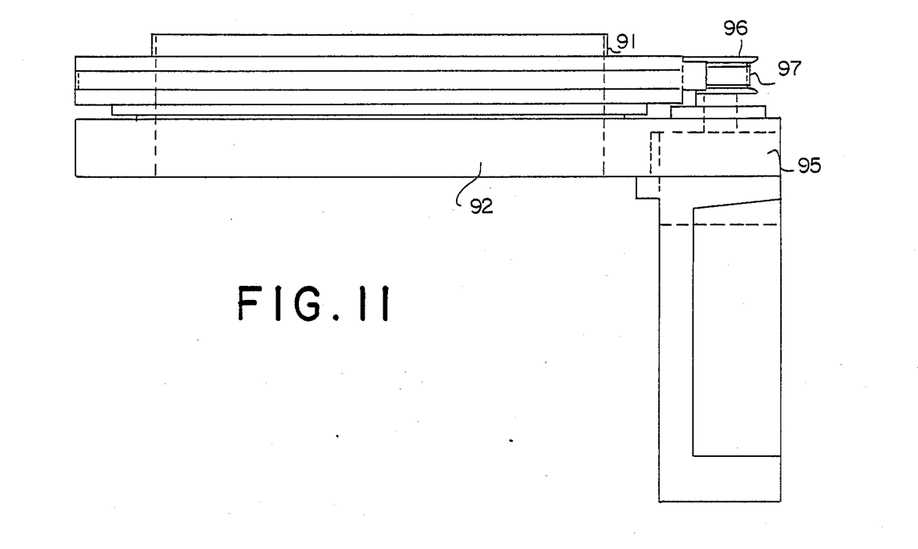
FIG. 11 is a front view thereof.
Figure 12:
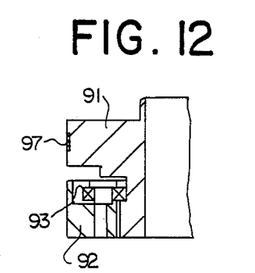
FIG. 12 is a cross sectional view taken along line XII—XII in FIG. 10.
Figure 13:
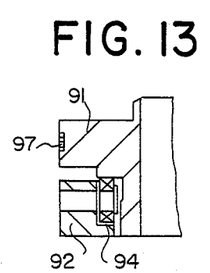
FIG. 13 is a cross sectional view taken along line XIII—XIII in FIG. 10.
Figure 14:
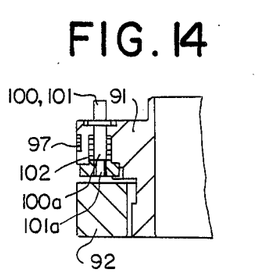
FIG. 14 is a cross sectional view taken along line XVI—XVI in FIG. 10.

In FIGS. 10 and 14, bridge parts 100 and 101 for fastening the pressing ring 86 are inserted into the ring holder 91 in positions which are symmetrical with respect to the center of the ring holder 91. Each of these bridge parts 100 and 101 has a shaft part 100a and 101a, respectively, which is constantly driven downward with respect to the ring holder 91 by the force of a coil spring 102. The uppermost portion of each of these shaft parts 100a and 101a is formed into a roughly rectangular shape, a shape formed by cutting two faces from the circumference of a disk.

The pressing ring 86 as seen in FIG. 9 is equipped with rectangular holes 86c and 86d which face the bridge parts 100 and 101. The roughly rectangular portions of the bridge parts 100 and 101 can be inserted into the rectangular holes 86c and 96d. As shown in FIGS. 1, 2, 3 and 9, rotating shafts 103 and 104 and rotating bridge parts 107 and 108 are installed on the elevator platform 60. The rotating bridge parts 107 and 108 fit over the rotating shafts 103 and 104 so that they can be freely moved by coil springs 105 and 106. The rotating bridge parts 107 and 108 have grooves in their lower ends that can fit over the roughly rectangular portions of the bridge parts 100 and 101 (see FIGS 10 and 14). Pulleys 109, 110 and 111 are respectively installed on the upper ends of the rotating shafts 78, 103 and 104 on the elevator platform 60, and a belt 114 is mounted on these pulleys 109, 110 and 111 as well as on a pulley 113 which is fastened to the output shaft of a motor 112 supported on the elevator platform 60.

As shown in FIGS. 1 through 3, two pipes 115 and 116 which project upwardly are mounted on the left side of the base 21. If necessary, hot air is blown through these pipes 115 and 116 by means not shown in the Figures.

Next, the operation of the wafer supplying apparatus described above will be given.

Before starting the apparatus, the slider 26 is positioned slightly further to the right than the position shown in FIGS. 1 and 2, and the gate-form column 49 is positioned at an intermediate point, i.e., further to the left than the position shown in the Figures.

The elevator magazine (not shown) installed at the left end of the base 21 is positioned so that the supply ring 42 with an attached wafer sheet 41 is waiting in the supply position. The piston 39 thrusts outward immediately before this so that the movable claw 33 is opened. Afterward, the rodless air cylinder 27 is actuated, and the slider 26 moves toward the left.

When the slider 26 reaches its farthest leftward position, the outside edge of the supply ring 42 is positioned between the fixed claw 30 and the movable claw 33. Then, the piston 39 is retracted, and the movable claw 33 is closed. As a result, the supply ring 42 is chucked between the fixed claw 30 and the movable claw 33. Afterward, when the rodless cylinder 27 is operated in reverse so that the slider 26 is caused to move toward the right, the supply ring 42 with the wafer sheet 41 attached thereto is pulled out of the elevator magazine (not shown) and is guided by the guide plates 43 and 44. The slider 26 then moves further toward the right, so that the supply ring 42 is positioned inside the guide parts 89 and 90.

Next, the piston 39 is operated again so that the movable claw 33 is opened, and the supply ring 42 is transferred to the guide parts 89 and 90. Then, the slider 26 is caused to move even further toward the right, and the air cylinders 54 and 55 are operated so that the elevator platform 60 is raised and the fixed claw 30 can pass under the supply ring 42. Thus, the wafer sheet 41 and the supply ring 42 are temporarily moved upward so that they are out of the way, and the slider 26 is moved toward the left. Furthermore, the gate-form column 49 is moved toward the right by the action of the rodless air cylinder 50 and is thus shifted to a position over the ring holder 91.

Afterward, when the air cylinders 54 and 55 are operated in reverse, the elevator platform 60 begins to descend. As a result, the wafer sheet 41 first contacts the upper surface of the cylindrical part of the ring holder 91 and is then supported thereon. When the pressing ring 86 descends so that it pushes the supply ring 42 downward around the circumference of the cylindrical part of the ring holder 91, the wafer sheet 41 is uniformly stretched radially, so that gaps are created between individual adjacent pellets on the surface of the wafer sheet 41. Thus, the pellets can be picked up by suction-adhesion (a method known in prior art) without any difficulty.

When the pressing ring 86 descends so that the roughly rectangular portions formed on the upper ends of the bridge parts 100 and 101 are inserted into the holes 86c and 86d of the pressing ring 86, the rotating bridge parts 107 and 108 are lowered so that the grooves formed in their lower ends fit over the bridge parts 100 and 101. Subsequently, when the motor 112 is operated, the rotating shafts 103 and 104 rotate so that the rotating bridge parts 107 and 108 are rotated 90°, thus causing similar rotation of the bridge parts 100 and 101. As a result, the uppermost parts of the bridge parts 100 and 101 are positioned across the holes 86c and 86d of the pressing ring 86 so that the pressing ring 86 is fastened to the ring holder 91. At this time, the rotating shaft 78 also rotates simultaneously so that the rollers 80 and 81 push the connecting parts 69 and 70 outward. Thus, the suspending parts 71, 72, 73 and 74 are opened outward so that support of the pressing ring 86 by the suspending parts is released.

Thereafter, the elevator platform 60 is again raised, and the gate-form column 49 moves to the left so that it is positioned at an intermediate point shown in FIGS. 1 and 2. As a result, the wafer sheet 41 supported on the ring holder 91 is thus exposed so that the supply of the pellets to the pellet pick-up device is ready. Then, the orientation of the pellet arrangement on the wafer sheet 41 and the directions of movement of the X-Y table supporting the ring holder 91 are adjusted using an image recognition device such as a television camera, etc. (not shown in the Figures). Adjustment can be accomplished by slightly rotating the ring holder 91 itself with the motor 95.

Afterward, the pellets on the wafer sheet 41 are successively picked up using the movement of the X-Y table and the action of a pellet suction-adhesion nozzle according to a method known in prior art.

After all of the pellets have been picked up, the gate-form column 49 moves to the right, and the elevator platform 60 is lowered. The motor 112 is actuated so that the rotating bridge parts 107 and 108 are rotated 90° in an opposite direction to the direction of the first 90° rotation of the parts mentioned above, and the bridge parts 100 and 101 are rotated. The suspending parts 71, 72, 73 and 74 are caused to move underneath the pressing ring 86. Then, when the elevator platform 60 is raised, the wafer sheet 41 is supported by the guide parts 89 and 90, and the supply ring 42 is supported by the suspending parts 71, 72, 73 and 74.

Next, the gate-form column 49 moves to the left so that it is positioned at an intermediate point as shown in FIGS. 1 and 2. At the same time, the slider 26 moves to the right so that it is positioned at the right end of the gate-form column 49. Afterward, the elevator platform 60 is lowered so that the supply ring 42 is positioned in front of the fixed claw 30 and movable claw 33, and the movable claw 33 is opened. The slider 26 moves to the left so that the supply ring 42 is positioned between the fixed claw 30 and the movable claw 33. The movable claw 33 is then closed so that the supply ring 42 is chucked. Then, the slider 26 again moves to the left and returns the supply ring 42 to the elevator magazine. At this time, the wafer sheet 41 is stretched with respect to the supply ring 42 and therefore sags, preventing the supply ring 42 from returning to the elevator magazine. Accordingly, before the supply ring 42 is returned to the elevator magazine, hot air is shot out from the pipes 115 and 116 so that the wafer sheet 41 is shrunk by the heat of the hot air, thus eliminating any sagging of the wafer sheet 41 from the supply ring 42.

As is clear from the above description, the present invention provides a wafer supplying apparatus wherein pellets are picked up one at a time merely by attaching a wafer sheet with pellets adhered directly thereto to a supply ring without the necessity of any pretreatment of the wafer sheet.

We claim:
1. A wafer supplying apparatus comprising:
   a supply ring to which a wafer sheet with pellets adhered thereto is attached;
   an elevator magazine which accommodates said supply rings in a stacked configuration;
   a pellet pick-up device provided at a fixed distance from said elevator magazine;
   a ring holder attached to an X-Y table of said pellet pick-up device, said ring holder supporting and placing said wafer sheets one at a time on the upper surface of a cylindrical part of said ring holder which has an external diameter smaller than the internal diameter of said supply rings;
   a gate-form column which can move back and forth from an intermediate point between said elevator magazine and said ring holder to a point above said ring holder, said gate form column also moving upward and downward;
   guide means provided on said gate form column, said guide means holding said supply rings one at a time while said supply rings are being handled in said apparatus;
   an annular pressing ring which presses against a portion of each of said supply rings;
   suspending means provided on said gate-form column, said suspending means holding said pressing ring above said supply rings held in said guide means;
   a driving means for vertically moving said gate-form column, said driving means pushing said gate-form column downward and pushing said supply rings downward around said cylindrical part of said ring holder through said pressing ring;
   a fastening means provided on said gate-form column, said fastening means fastening said pressing ring to said ring holder after said supply rings have been pushed downward by said driving means; and
   a transporting means which moves back and forth and chuck-transports said supply rings between said elevator magazine and said guide means provided on said gate-form column.

* * * * *